(12) United States Patent
Okinaka et al.

(10) Patent No.: US 8,178,026 B2
(45) Date of Patent: May 15, 2012

(54) NANOIMPRINTING METHOD AND MOLD FOR USE IN NANOIMPRINTING

(75) Inventors: Motoki Okinaka, Inagi (JP); Junichi Seki, Yokohama (JP); Atsunori Terasaki, Kawasaki (JP); Shingo Okushima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 623 days.

(21) Appl. No.: 12/405,847

(22) Filed: Mar. 17, 2009

(65) Prior Publication Data

US 2009/0273124 A1 Nov. 5, 2009

(30) Foreign Application Priority Data

Mar. 18, 2008 (JP) ................... 2008-068851

(51) Int. Cl.
*B29C 35/08* (2006.01)
*B29C 59/02* (2006.01)
(52) U.S. Cl. .............. 264/319; 264/496; 264/293
(58) Field of Classification Search .............. 264/334, 264/161, 496, 293, 259, 338, 132, 130, 134–135, 264/264–265
See application file for complete search history.

(56) References Cited

U.S. PATENT DOCUMENTS

| | | | |
|---|---|---|---|
| 6,162,745 A * | 12/2000 | Ito et al. ............ | 438/795 |
| 7,077,992 B2 | 7/2006 | Sreenivasan et al. | |
| 2005/0260349 A1 | 11/2005 | Pawlowski et al. | |
| 2005/0270312 A1 | 12/2005 | Lad et al. | |

FOREIGN PATENT DOCUMENTS

| | | | |
|---|---|---|---|
| EP | 1762893 A1 * | 3/2007 | |
| JP | 2007-326296 A | 12/2007 | |

OTHER PUBLICATIONS

Stephen Y. Chou et al, Imprint of sub-25 nm vias and trenches in polymers, Appl. Phys., Lett, vol. 67, Issue 21, pp. 3114-3116 (1995).

* cited by examiner

*Primary Examiner* — Christina Johnson
*Assistant Examiner* — Xue Liu
(74) *Attorney, Agent, or Firm* — Canon U.S.A., Inc., IP Division

(57) ABSTRACT

A nanoimprinting method includes: forming at a region for performing a first nanoimprinting process on a substrate, a first patterning region with a first affinity to resin; forming at a region for performing a second nanoimprinting process on the substrate, a second patterning region with a second affinity to resin, the second affinity being lower than the first affinity; applying the resin to the first patterning region and transferring a pattern of a mold to the resin by the first nanoimprinting process; and modifying the second patterning region to a region with affinity to resin that is higher than the second affinity, then applying the resin to the modified region, and performing the second nanoimprinting process to process the second patterning region thereby connecting patterns formed at the first patterning region and the second patterning region to each other.

11 Claims, 5 Drawing Sheets

NANOIMPRINTING METHOD AND MOLD FOR USE IN NANOIMPRINTING

BACKGROUND OF THE INVENTION

1. Field of the Invention

The present invention generally relates to a nanoimprinting method and a mold for use in nanoimprinting, and more particularly, to a nanoimprinting method and a mold which transfer a micropattern on a mold to a resin in a large area.

2. Description of the Related Art

Recently, a microprocessing technology for easily carrying out reverse transfer of a microstructure on a mold to a workpiece such as a resin or a semiconductor substrate has been developed and has received attention (see Stephen Y. Chou et. al., Appl. Phys., Lett., Vol. 67, Issue 21, pp. 3114-3116 (1995)).

This technology is called nanoimprint or nano-embossing, and a processing size thereof matches with the size of the microstructure of a mold. Transfer of structures from the order of micrometers to the order of 10 nm or less has been reported.

Principles of nanoimprinting are relatively simple, and the process may be carried out, for example, as follows.

First, a workpiece having a resin applied to a substrate (e.g., semiconductor wafer) is prepared. As such a resin, there may be utilized a photocurable resin, a thermoplastic resin, a thermosetting resin, or the like. After a mold having a predetermined unevenness pattern formed thereon is brought into contact with the workpiece, a resin is filled therebetween and is cured by ultraviolet light irradiation or through a heating/cooling step. Then, the mold is released to achieve reverse transfer of the pattern on the resin.

This technology can provide full transfer of a three-dimensional structure, and hence it is expected not only to be the next-generation semiconductor fabrication technology to replace light exposure apparatuses such as a stepper and scanner, but is also a promising technology for application to a variety of fields, such as application in an optical device, a bio device, a patterned medium, a display and the like.

In consideration of applying nanoimprinting to the above-mentioned applications, there may be a case where patterning of a large area is to be performed.

In such a case, while full transfer with a large mold is one way of patterning, a more suitable way may be a known step-and-repeat method of achieving sequential transfer using a mold smaller than a workpiece (see U.S. Pat. No. 7,077,992).

According to the method, designing a smaller mold can reduce the fabrication cost which is involved in enlargement in the size of molds.

Furthermore, a known resin application method which is adapted to the step-and-repeat method is a drop-on-demand method of applying a resin per each shot of nanoimprinting, as opposed to full application to the entire surface by spin coating (see U.S. Patent Application Publication No. 2005/0270312).

According to this method, the amount of a resin may be locally adjusted depending on the pattern density and shape of a mold, resulting in improved uniformity of thickness of the remaining film and improvement in the transfer accuracy.

However, execution of nanoimprinting with the step-and-repeat method applied to patterning of a large area may bring about the following issue.

That is, at the time of carrying out such nanoimprinting as described above, a resin may run out (or run off or protrude) from the end surface of a mold while being filled between the mold and the substrate, and the run-out resin, if present between adjacent patterns, may impair the accuracy in connecting the patterns to each other.

FIG. 7 illustrates an example of transfer of a periodic dot pattern by nanoimprinting that illustrates resin that has run-out or overflowed from between the mold and the substrate.

In the example illustrated in FIG. 7, a resin 401 is applied on a substrate 102 and is processed with a protruding mold 301 by step-and-repeat type nanoimprinting to pattern a large area.

In FIG. 7, X is the period of the dot pattern, and Y is an interval between adjacent shots (ranges in each of which transfer can be performed using the mold).

In general, it can be difficult to control spreading of a resin at the end surface of a mold in nanoimprinting, and there are cases where the resin may run or overflow out of the end surface of the mold, thus yielding a run-out resin 402.

The presence of such run-out resin 402 can make it difficult to bring the patterns of adjacent shots close to each other to a desired distance.

Specifically, the distance Y between shots may become greater than the period X of the dot pattern, and hence a complete periodic structure may not be attained in a large area.

This issue is not peculiar to a dot pattern, but may also apply to other periodic patterns, a continuous pattern such as line and space, and a free pattern. For the reason described above, the step-and-repeat method may cause difficulty in connecting adjacent patterns to each other to obtain a larger periodic pattern.

SUMMARY OF THE INVENTION

According to an aspect of the present invention, there is provided a nanoimprinting method of transferring a pattern of a mold by performing nanoimprinting at least twice. The method includes:

forming at a region for performing a first nanoimprinting process on a substrate, a first patterning region with a first affinity to resin;

forming at a region for performing a second nanoimprinting process on the substrate, a second patterning region with a second affinity to resin, the second affinity being lower than the first affinity;

applying resin to the first patterning region and transferring a pattern of a mold to the resin by the first nanoimprinting process; and modifying the second patterning region to a region with affinity to resin that is higher than the second affinity, then applying resin to the modified region, and performing the second nanoimprinting process to process the second patterning region thereby connecting patterns formed at the first patterning region and the second patterning region to each other.

Further, according to another aspect of the present invention, there is provided a mold for use in nanoimprinting, which includes a third patterning region having a third affinity to resin and formed in a transfer region of a processing surface of the mold; and a fourth patterning region having a fourth affinity to the resin that is higher than the third affinity, and formed outside the third patterning region of the mold, for adhering to and removing, at a time of releasing of the mold, resin that runs out from an end surface of the mold when performing nanoimprinting.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain principles of the invention.

DESCRIPTION OF THE EMBODIMENTS

Figure 1A:
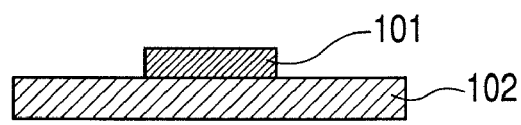
FIGS. 1A, 1B, 1C and 1D are schematic diagrams illustrating a method of patterning a high affinity region and a low affinity region, which have resin affinities controlled, onto a substrate according to Examples 1 to 4 of the present invention.

Embodiments of the present invention will now be described in detail with reference to the accompanying drawings.

An embodiment of the nanoimprinting method in accordance with the present invention is described. According to the embodiment of the nanoimprinting method, first, a region with a first affinity to a resin that is a relatively high affinity (hereinafter, sometimes simply referred to as "high affinity region") and a region with second affinity to a resin that is lower than the first affinity (hereinafter, sometimes simply referred to as "low affinity region") are patterned on a substrate and a surface of a mold when forming a pattern, such as a pattern with a relatively large area. For example, a first patterning region may be formed on the substrate with a first affinity to resin that may be a relatively high affinity, and a second patterning region may be formed on the substrate with a second affinity to resin that is lower than the first affinity.

The term "affinity" as herein employed refers to either one or both of adhesion to a resin and wettability to a resin.

In other words, a high affinity region may be a region having a relatively high adhesion, a relatively high wettability, or both of a relatively high adhesion and high wettability, and a low affinity region may be a region having a relatively low adhesion, a relatively low wettability, or both of a relatively low adhesion and low wettability region, such one or more of an adhesion and wettability that are lower than that of the high affinity region.

According to the nanoimprinting method of the embodiment, nanoimprinting may be performed at least twice to form a relatively large-area pattern.

In carrying out the method, a first nanoimprinting process may be performed at a high affinity region (i.e., first patterning region with first affinity) on a substrate, and a second nanoimprinting is performed at another region (i.e., second patterning region) previously having a low affinity (i.e., second affinity), which low affinity has been modified to a higher affinity, such as an affinity that is higher than the low affinity (i.e., an affinity higher than the second affinity).

According to one aspect of the invention, the high affinity region and the low affinity region may each have the same or substantially the same size as a pattern of a mold which is transferred in one transfer operation.

In one version, at the time of performing the first nanoimprinting process, the mold is brought into contact with a resin applied to the high affinity region on the substrate to thereby transfer a pattern to the resin.

At this time, a difference between the affinity of the mold and the affinity of the patterned substrate may be utilized to restrict the resin transfer region.

That is, by utilizing the property of a resin of its being difficult to spread in the low affinity region having low affinity to the resin, nanoimprinting may be performed while restricting the spreading of the resin from the high affinity region having high affinity to the resin. In other words, the first nanoimprinting process may be performed while utilizing a property of the resin whereby spreading of the resin to the low affinity region (i.e., the second patterning region) from the high affinity region (i.e., first patterning region) is suppressed.

Thereafter, at the time of performing the second nanoimprinting process, a portion of the substrate to which the resin has not transferred, that is, the low affinity region (i.e., second patterning region), may be modified into a region having a higher affinity, and then the second nanoimprinting process may be performed on the modified higher affinity region (i.e., second patterning region).

Aspects of the invention may thus provide for a nanoimprinting method and nanoimprinting mold that allow for processing so as to connect patterns of adjacent shots to each other with good accuracy.

According to one version, in the second nanoimprinting process, a difference between the affinity of the resin to the mold and the affinity of the resin to the substrate is not utilized, and the nanoimprinting process is performed while restricting a region in which the resin spreads by utilizing a resin structure previously formed by the first nanoimprinting process.

In this version, the resin structure nanoimprinted in the first nanoimprinting process can be utilized as a physical wall to inhibit the flow of the resin.

By following the above-described example procedure, nanoimprinting which connects adjacent patterns to each other with improved accuracy can be realized.

EXAMPLES

Examples of the present invention are described below with reference to the accompanying drawings.

Throughout the description, like reference numerals are employed to refer to like elements in the respective figures.

Example 1

In Example 1, the description is given of a nanoimprinting method to which aspects of the present invention are applied, and which utilizes adhesion as an affinity for the resin, and a mold which is used in the nanoimprinting method.

FIGS. 1A to 1D and FIGS. 2A to 2C are schematic diagrams for illustrating an example of a method of patterning on a substrate, including a high adhesion region (i.e., first patterning region) and a low adhesion region (i.e., second patterning region) which are controlled to provide adhesion to a resin.

Figure 1B:
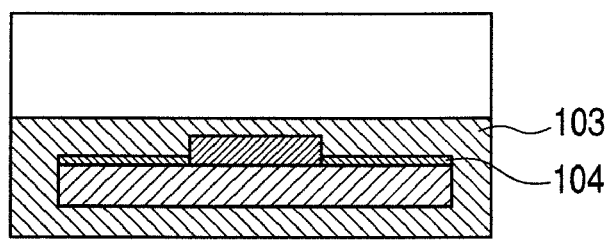
Figure 1C:
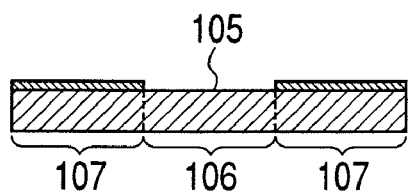
Figure 1D:
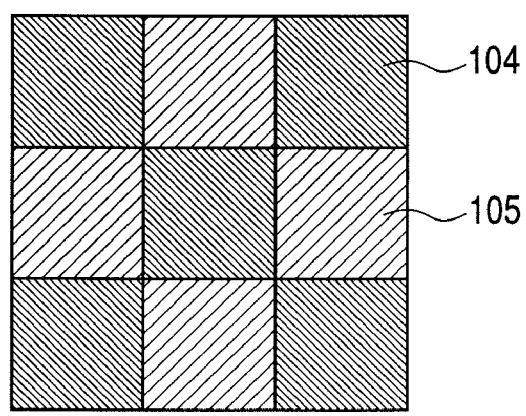
Figure 2A:
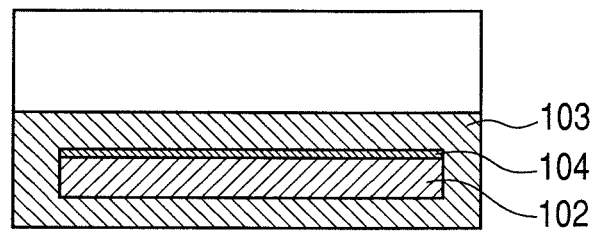
FIGS. 2A, 2B and 2C are schematic diagrams illustrating another method of patterning a high affinity region and a low affinity region, which have resin affinities controlled, onto a substrate according to Examples 1 to 4 of the present invention.
Figure 2B:
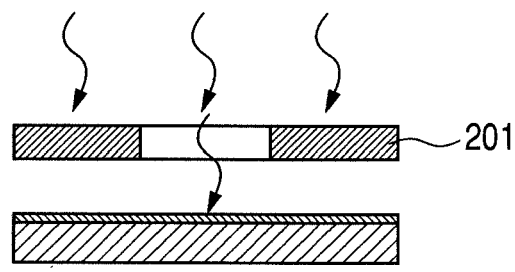
Figure 2C:
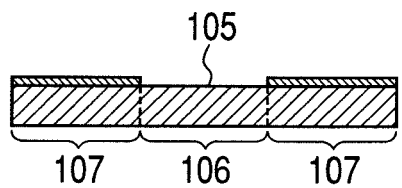

FIGS. 1A to 1D are referred to in describing an example of a method using a resist pattern, and FIGS. 2A to 2C are referred to in describing an example of a patterning method using a mask.

In FIGS. 1A to 1D, reference numeral 101 denotes a resist, 102 denotes a substrate, 103 denotes an adhesion reducing solution, 104 denotes a low adhesion region (i.e., low affinity region), 105 denotes a high adhesion region (i.e., a high affinity region having a higher adhesion to resin than the low adhesion region 104), 106 denotes a first patterning region, and 107 denotes a second patterning region.

The adhesion reducing solution 103 is a solution which reduces the adhesion to a resin, and is used to form the low adhesion region 104 on the substrate, or on a mold. Incidentally, that the first patterning region 106 is a region in which the first nanoimprinting process is performed.

The second patterning region 107 is a region in which the second nanoimprinting process is performed, and a pattern that connects to the pattern transferred in the first nanoimprinting process can be formed. FIGS. 1A to 1C are cross-sectional views, and FIG. 1D is a plan view.

In the nanoimprinting method of the present example, first, in a step illustrated in FIG. 1A, a pattern using the resist 101 is formed on the substrate 102.

As the resist 101, a resist which can be removed after processing (i.e., in a final step) may be used, including one or more of a resist for photolithography, a resist for electron beam lithography, and the like.

As the method of forming a resist pattern, any method suitable for the resist material concerned may be selected. The shape to be patterned by the resist 101 may be designed so as to be the same as that formed by one shot of nanoimprinting, i.e., the same shape as that of the first patterning region or as that of the second patterning region.

Thereafter, in a step illustrated in FIG. 1B, the patterned resist substrate prepared in the step illustrated in FIG. 1A is dipped in the adhesion reducing solution 103 to modify a surface of the second patterning region 107 having no resist applied thereon into the low adhesion region 104.

The adhesion reducing solution 103 may be, for example, a mold releasing agent to improve the releasability of the mold, and may also be formed of, for example, a material which can be formed into a monomolecular film.

In one version, the reason for utilizing the monomolecular film may be that the monomolecular film can reduce the unevenness of the substrate surface, which may be suitable in nanoimprinting.

Another reason may be that the smaller film thickness may allow for easier removal of the film.

The low adhesion region 104 may be formed not only by dipping in the adhesion reducing solution 103 such illustrated in FIG. 1B but also and/or alternatively by one or more of spray coating, spin coating, CVD, evaporation, and the like.

Finally, the resist 101 is removed to thereby form a mixed pattern of the low adhesion region 104 and the high adhesion region 105, such as illustrated in FIG. 1C.

The removal of the resist 101 can be achieved by, for example, dipping in a solution in which the resist 101 is soluble. One example of the patterned layout of the low adhesion regions 104 and the high adhesion regions 105 is a checkered pattern such as illustrated in FIG. 1D.

FIGS. 2A to 2C illustrate another example of a method of forming a low adhesion region 104 and a high adhesion region 105. In FIGS. 2A to 2C, reference numeral 201 denotes a mask.

According to the method of this example, first, in a step illustrated in FIG. 2A, a substrate 102 is dipped in an adhesion reducing solution 103 such that the entire surface of the substrate becomes the low adhesion region 104.

Next, in a step illustrated in FIG. 2B, with the mask 201 being used for the low adhesion region 104, the substrate 102 is irradiated with energy, for example one or more of an electromagnetic wave and charged particles are locally irradiated. In one version, the electromagnetic wave may have energy equal to or greater than the energy of ultraviolet light.

Thereby, the material on the low adhesion region 104 which lowers the adhesion may be locally removed, and the low adhesion region 104 may be modified to the high adhesion region 105.

Examples of such removing and modifying methods may include one or more of decomposition of the material by physical sputtering with charged particles such as $O_2$ plasma, and ultra violet (UV) light irradiation.

In the method of the present example, UV irradiation is mentioned as one example of irradiation with an electromagnetic wave, but irradiation with another kind of electromagnetic wave having energy sufficient to decompose the material for reducing the adhesion may also be used. The mask 201 may be designed depending on the method used, and in the case of using an $O_2$ plasma, a mask having an opening may be provided in order to allow the charged particles to reach the low adhesion region 104 through the opening.

In one version, the use of UV irradiation may involve a mask having a region which can transmit UV light and a region which cannot transmit UV light. For example, a photomask may be used.

Through the above-mentioned steps, the low adhesion region 104 and the high adhesion region 105 as illustrated in FIG. 2C can be relatively easily patterned.

Figure 3:
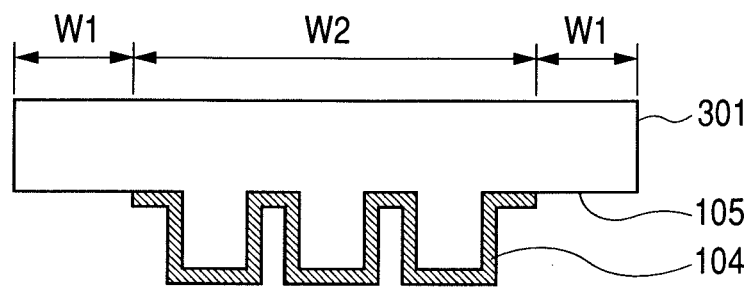
FIG. 3 is a schematic diagram illustrating a mold used in a nanoimprinting method according to Examples 1 to 4 of the present invention.

FIG. 3 illustrates a mold 301 used in the nanoimprinting method of the present example. In the present example, the mold 301 has a predetermined pattern on its surface, and may be made of a material such as, for example, one or more of silicon, quartz, or sapphire.

In one version, the mold 301 has a processing surface for processing the first patterning region 106 and second patterning region 107 of the substrate 102. For example, the mold 301 may have a low adhesion region 104 (i.e., third patterning region having a third affinity) that is patterned on the pattern forming surface of the mold 301, and a high adhesion region 105 (i.e., fourth patterning region having a fourth affinity that is higher than the third affinity) that is patterned outside (i.e., at the periphery of) the low adhesion region 104.

The patterning of the low adhesion region 104 and the high adhesion region 105 may be performed by, for example, the method such as illustrated in FIGS. 1A to 1D or FIGS. 2A to 2C.

In one version, the low adhesion region 104 on the pattern forming surface of the mold 301 may have the same or substantially the same shape and/or size as that of the first patterning region 106 or the second patterning region 107 illustrated in FIG. 1C and FIG. 2C.

The low adhesion region 104 formed on the mold 301 may serve in such a way that the resin on the substrate is not transferred to the low adhesion region 104 (i.e., third patterning region) on the mold 301 at the time of mold release.

On the other hand, a resin which runs out (or protrudes or overflows) from the end surface of the mold 301 onto the substrate may be adhered to the high adhesion region 105 (i.e., fourth patterning region) on the mold 301, and can be transferred from the substrate side to the mold 301 side and removed at the time of mold release. That is, at the time of releasing of the mold, the resin applied to the substrate and being in contact with the fourth patterning region (i.e., high adhesion region) on the processing surface of the mold may be adhered to the fourth patterning region and removed from the substrate.

Thus, portions of resin which run out onto the surface of the substrate from an end surface of the mold can be removed from the substrate when a pattern formed on the processing surface of the mold is transferred.

As the shape of the high adhesion region 105 (i.e. fourth patterning region) on the mold 301 side, in one version a mold may be included which is provided with a microstructure on its surface to increase the surface area thereof as compared to the surface area of, for example, the low adhesion region 104 (i.e., second patterning region 107) on the substrate, whereby the adhesion to the resin may be further improved. Thus, at the time of releasing of the mold, the resin that runs out onto the surface of the substrate is brought into contact with the fourth patterning region and removed from the substrate.

When the width of the high adhesion region (i.e., fourth patterning region) on the mold 301 is represented by W1 and the width of the low adhesion region (i.e., third patterning region) in a transfer region of a processing surface of the mold 301 is represented by W2, the mold 301 can be designed such that the relationship between W1 and W2 satisfies the condition $0.5 \times W2 \leq W1 < W2$. The use of such a mold may permit a run-out resin portion 402 to be removed at the same time as the transfer.

In a case where a checkered pattern such as illustrated in FIG. 1D is to be formed, for example, resin removal can be performed at least twice in a single non-transfer region (i.e., low adhesion region 104).

FIGS. 4A to 4H are schematic diagrams illustrating an example of a nanoimprinting method which allows adjacent patterns to be connected to each other with good accuracy.

Figure 4A:
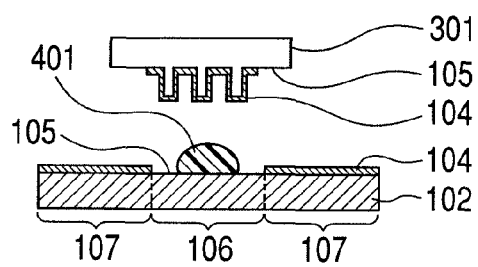
FIGS. 4A, 4B, 4C, 4D, 4E, 4F, 4G and 4H are schematic diagrams illustrating a nanoimprinting method according to Example 1 of the present invention, which allows adjacent patterns to be connected to each other with good accuracy.
Figure 4E:
Figure 4B:
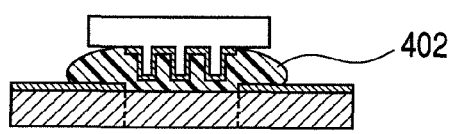

In the figure, reference numeral 401 denotes a resin, and 402 denotes, as illustrated in FIG. 4B, a resin portion which has run out (i.e., protruded or overflowed) from the patterning region at the time of nanoimprinting.

First, as illustrated in the example shown in FIG. 4A, a substrate 102 and a mold 301 each having a low adhesion region 104 and a high adhesion region 105 described with reference to FIGS. 1 to 3 patterned thereon are prepared.

Subsequently, the resin 401 is applied to the high adhesion region 105 on the first patterning region 106 on the substrate side.

As the resin 401, one or more of a photocurable resin, a thermosetting resin, a thermoplastic resin, and the like, such as for example at least one of an acrylic resin and an epoxy resin, may be provided.

As an example of the application process of the resin 401, a droplet application process using at least one of an ink jet and dispenser may be included. By this process, fine control of the amount of the resin can be attained locally depending on the pattern density and the shape of the mold 301, whereby the thickness of the residual resin 401 at the time of nanoimprinting can be made relatively uniform, thereby improving the transfer precision.

Furthermore, as other coating processes, for example, one or more of spin coating, spray coating, evaporation, sputtering, and the like, may be adopted.

FIG. 4B illustrates an example of a schematic diagram at the time of the first nanoimprinting process.

After performing positional alignment of the low adhesion region 104 on the mold 301 with the high adhesion region 105 on the substrate 102, the mold 301 is brought into contact with the resin 401 to thereby carry out the first nanoimprinting process.

Figure 4F:
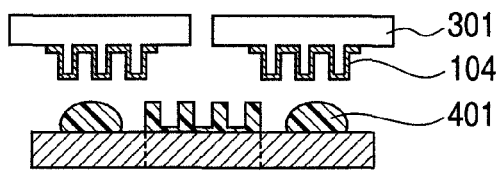
Figure 4C:
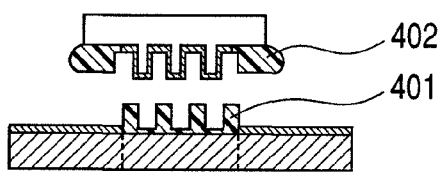

FIG. 4C illustrates an example of the state in which the mold 301 is released from the resin 401.

The resin 401 is released from the low adhesion region 104 on the mold 301 and adheres to the high adhesion region 105 on the substrate 102.

On the other hand, due to low adhesion to the low adhesion region 104 on the substrate 102, the run-out resin 402 adheres to the high adhesion region 105 on the mold side to be removed from the substrate 102.

As a result, the micropattern of the mold 301 is transferred substantially only to the high adhesion region 105 formed on the substrate 102.

Next, preparation for the second nanoimprinting process can be carried out.

First, the low adhesion region 104 on the second patterning region 107 is modified into a high adhesion region 105 having a higher adhesion than that prior to the modification. FIG. 4D illustrates an example of the modification process.

Although examples of the modification process can include $O_2$ plasma irradiation and UV light irradiation, in one version the UV light irradiation may be performed because of smaller damage to the patterned resin 401.

As an example of the UV light irradiation process, for example, the surface of the substrate 102 with the patterned resin may be modified through a process in which the substrate 102 is left directly under a high-pressure mercury lamp of 250 W for 15 minutes.

Furthermore, in the case of performing $O_2$ plasma irradiation, for example, the surface of the substrate 102 with the patterned resin can be modified through a process in which the substrate 102 is exposed under the conditions of an $O_2$ flow rate of 100 Sccm, a plasma output of 100 W, and an irradiation time of 5 minutes.

In the $O_2$ plasma irradiation process, it may be important to set the mask 201 and the substrate 102 sufficiently close to each other and apply a sufficient bias to the plasma in a high vacuum chamber.

By adopting such conditions, the directivity of the $O_2$ plasma can be improved, and the low adhesion region 104 can be modified into a high adhesion region 105 while also substantially maintaining the pattern shape of the resin formed in the step shown in FIG. 4C (FIG. 4E).

The use of the $O_2$ plasma in the surface modification process may have an advantage that in a case where with the UV light irradiation, an adhesion-reducing material formed at the low adhesion region 104 remains as residue, the material can relatively effectively be removed by the physical sputtering effect of the $O_2$ plasma to thereby reliably modify the low adhesion region 104 into the high adhesion region 105.

Thereafter, the resin 401 may be applied to the high adhesion region 105 on the second patterning region 107 as illustrated in the example shown in FIG. 4F.

As the resin application process used at this time, since the resin is to be disposed selectively, in one version a local application process using a dispenser or an ink jet, as opposed to an entire surface application process such as spin coating or dip coating, may be used.

Figure 4G:
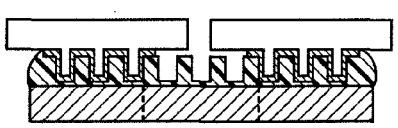
Figure 4D:
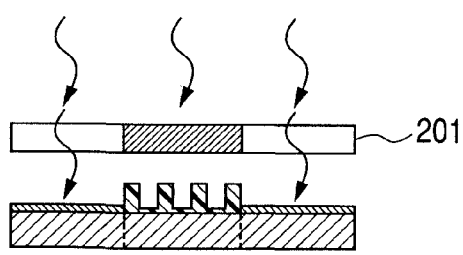

FIG. 4G is a schematic diagram illustrating an example of the second nanoimprinting step.

First, the mold 301 and the substrate 102 are aligned so as to connect the resin pattern 401 transferred to the first patterning region 106 and the second transfer pattern to each other with good accuracy.

The resin 401 applied in the second nanoimprinting process may have a spreading area that is limited by the resin structure formed in the first nanoimprinting process, and may therefore substantially only spread in the second patterning region 107 and may be subjected to nanoimprinting.

In one version, this is because the resin structure formed in the first nanoimprinting process can serve as a physical wall to inhibit the flow of the resin.

Figure 4H:

Finally, the mold is released as illustrated in the example shown in FIG. 4H, completing the nanoimprinting process.

The above-described method can enable relatively large-area nanoimprinting using the step-and-repeat system to connect adjacent patterns to each other with improved accuracy. That is, in the case where the first patterning region and the second patterning region are adjacent to each other, patterns to be formed at the both regions can be connected to each other with an improved accuracy.

Then, the substrate may be etched using the pattern formed in the multiple nanoimprinting steps as a mask, whereby a structural member (e.g., a chip) with a predetermined unevenness can be produced.

Example 2

The description of Example 2 of the present invention is given of nanoimprinting using wettability as affinity for the resin.

The patterning of the low wettability regions and high wettability regions of the substrate 102 and the mold 301 is the same and/or similar as that described for the low and high adhesion regions of Example 1 according to aspects of the present invention.

However, in Example 2, the adhesion reducing solution 103, the low adhesion region 104, and the high adhesion region 105 illustrated in FIGS. 1 to 3 become a wettability reducing solution 103, a low wettability region 104, and a high wettability region 105 (i.e., a region having higher wettability than the low wettability region 104), respectively.

FIGS. 5A to 5H are schematic diagrams illustrating a nanoimprinting method which allows adjacent patterns to be connected to each other with a relatively high accuracy when wettability is used as a means for affinity between a mold and a substrate.

Figure 5A:
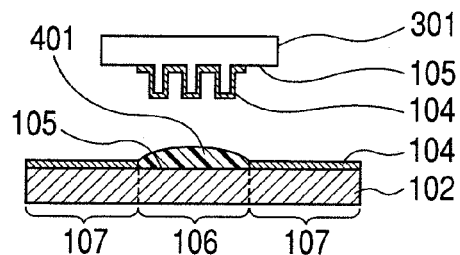
FIGS. 5A, 5B, 5C, 5D, 5E, 5F, 5G and 5H are schematic diagrams illustrating a nanoimprinting method according to Example 2 of the present invention, which allows adjacent patterns to be connected to each other with a high accuracy when wettability is used as an affinity between a mold and a substrate.

First, as illustrated in the example shown in FIG. 5A, a substrate 102 and a mold 301 on which the low wettability region 104 and the high wettability region 105, as analogously described referred to FIGS. 1 to 3 have been patterned are prepared.

Subsequently, a resin 401 is applied to the high wettability region 105 on the first patterning region 106 on the substrate side. The high wettability of the substrate surface causes the resin 401 to be wetted and spread.

On the other hand, when the wettability of the low wettability region 104 around the high wettability region 105 is sufficiently low, the application range of the resin is limited to the high wettability region 105.

As an example of the application process of the resin 401, a droplet application process using at least one of an ink jet and dispenser may be included. By this process, fine control of the amount of the resin can be attained locally depending on the pattern density and the shape of the mold 301, whereby the thickness of the residual resin 401 at the time of nanoimprinting can be made relatively uniform, thereby improving the transfer precision.

Furthermore, as other coating processes, for example, one or more of spin coating, spray coating, evaporation, sputtering, and the like may be adopted.

Even when these processes are employed, in the case where the wettability of the low wettability region 104 is sufficiently low, the low wettability region 104 is not coated with the resin 401 and the high wettability region 105 becomes selectively coated with the resin.

Figure 5E:
Figure 5B:
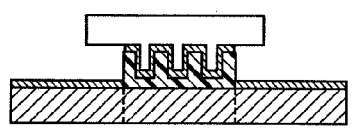

FIG. 5B illustrates an example of a schematic diagram at the time of nanoimprinting. After positional alignment of the low wettability region 104 on the mold 301 with the high wettability region 105 on the substrate 102, nanoimprinting is carried out by bringing the mold 301 into contact with the resin 401.

At this time, the effect of the wettability of the substrate surface suppresses the run-out of the resin.

Figure 5F:
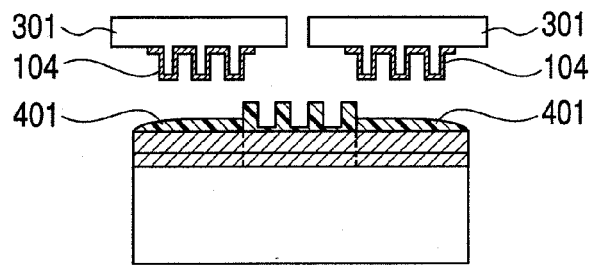
Figure 5C:
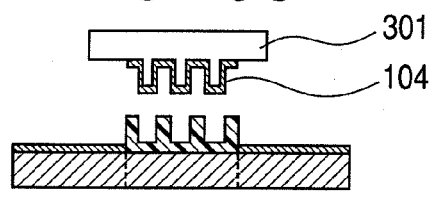

FIG. 5C illustrates an example of the state in which the mold 301 is released from the resin 401. The resin 401 is released from the low wettability region 104 on the mold 301 and adheres to the high wettability region 105 on the substrate 102.

As a result, the micropattern of the mold 301 is transferred substantially only to the high wettability region 105 formed on the substrate 102.

Next, the low wettability region 104 on the second patterning region 107 is modified into a high wettability region 105, such as a region having a wettability that is higher than that prior to the modification. FIGS. 5D and 5E illustrate a version of the modification process. Examples of the modification process can include at least one of $O_2$ plasma irradiation and UV light irradiation.

Thereafter, the resin 401 is applied to the high wettability region 105 (i.e., region modified to increase the wettability) on the second patterning region 107 as illustrated in FIG. 5F.

While the resin 401 may spread over substantially the entire surface of the high wettability region 105 (i.e., the region modified to increase the wettability) due to the wettability of the substrate surface, the spreading of the resin is restricted by the resin structure previously transferred by the first nanoimprinting process.

As the resin application process in the second nanoimprinting process, since the resin is to be disposed selectively, a local application process using, for example one or more of a dispenser or an ink jet, as opposed to an entire surface application process such as spin coating or dip coating, may be used.

Figure 5G:
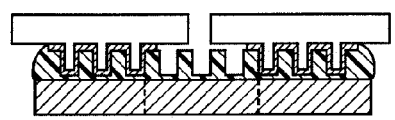
Figure 5D:
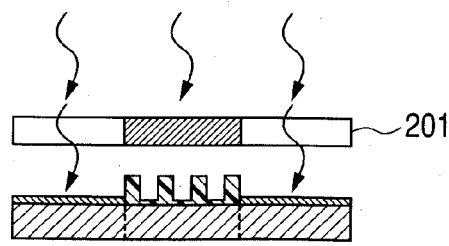

FIG. 5G is a schematic diagram illustrating an example of the second nanoimprinting step.

First, the mold 301 and the substrate 102 are aligned so as to connect the resin pattern 401 transferred to the first patterning region 106 and the second transfer pattern to each other with good accuracy.

Thereafter, nanoimprinting is carried out by bringing the mold 301 into contact with the resin 401

Figure 5H:

Finally, the mold is released as illustrated in the example shown in FIG. 5H, completing the nanoimprinting process.

Then, the substrate may be etched using the pattern formed in the multiple nanoimprinting steps as a mask, whereby a structural member (e.g., a chip) with a predetermined unevenness can be produced.

Example 3

The description of Example 3 of the present invention is given of a nanoimprinting process using both adhesion and wettability as affinity.

A region which has the both properties is referred to as "adhesion/wettability region" (e.g., a region having increased adhesion and wettability in comparison to another region).

In a case where a region has adhesion and wettability, patterning using both of the properties described in Examples 1 and 2 can be carried out.

Specifically, the region in which the resin 401 spreads due to the wettability of the substrate surface illustrated in FIGS. 4A to 4H or FIGS. 5A to 5H can be restricted within a high-adhesion/high-wettability region.

As a result, the resin 401 substantially and even entirely will not spread to a low-adhesion/low-wettability region (region having lower adhesion and wettability than the high-adhesion/high-wettability region) at the time of the first nanoimprinting process, and the pattern can be transferred within the high-adhesion/high-wettability region.

In one version, even when the resin 401 runs out (i.e., overflows or protrudes), because the low-adhesion/low-wettability region is present at the lower portion of the run-out resin 402 and because the high-adhesion/high-wettability region is present at the upper portion of the run-out resin 402, the run-out resin will adhere to the mold to be removed.

In the second nanoimprinting process, the spreading range of the resin 401 can be restricted by the resin structure transferred in the first nanoimprinting process, and the pattern can be transferred.

The above-described method attains relatively large-area patterning to connect adjacent patterns to each other with a good accuracy.

Example 4

The description of Example 4 of the present invention is given of a nanoimprinting process using a fluorine containing resin with improved releasability.

Figure 6A:
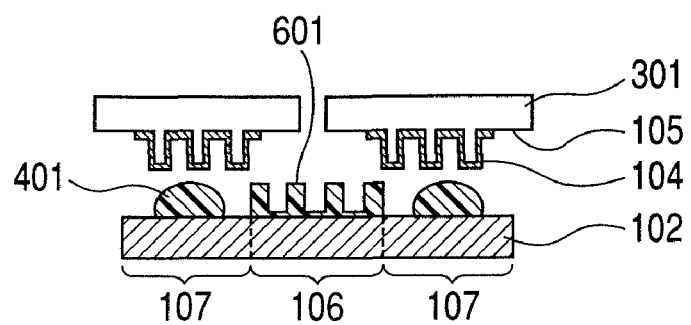
FIGS. 6A, 6B and 6C are schematic diagrams illustrating a nanoimprinting method according to Example 4 of the present invention in which a fluorine containing resin is used.
Figure 6B:
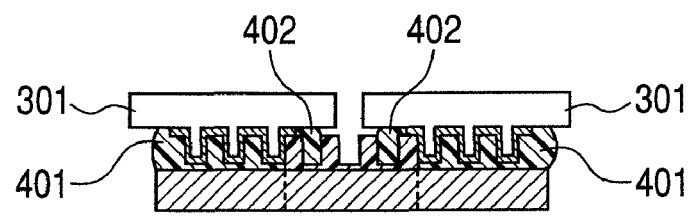
Figure 6C:
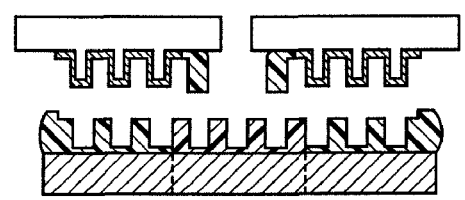
Figure 7:
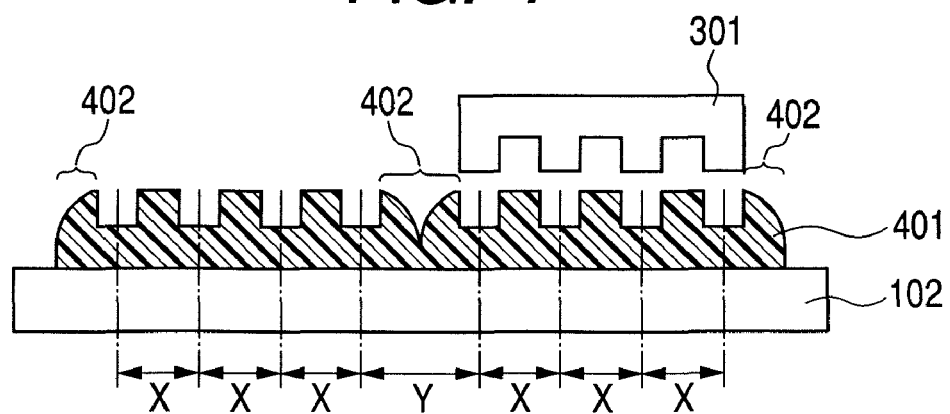
FIG. 7 is a schematic diagram illustrating an example of transfer of a periodic dot pattern by nanoimprinting for describing a problem which arises when a conventional step-and-repeat type nanoimprinting is carried out.

FIGS. 6A to 6C are schematic diagrams illustrating an example of a nanoimprinting method using a fluorine containing resin according to the present example.

The process of patterning the low affinity regions 104 and the high affinity regions 105 of the substrate 102 and the mold 301 is the same and/or similar as those described for Examples 1 to 3.

The present example differs from Examples 1 to 3 in that a fluorine containing resin 601 is applied to the first patterning region 106 in the first nanoimprinting process, and another resin 401 is applied onto the second patterning region 107 in the second nanoimprinting process.

Incidentally, in the present example, because the fluorine containing resin 601 and the other resin 401 are employed, it may be important to suitably select materials each having affinity to a corresponding one of the two kinds of resins.

The merit of using the fluorine containing resin 601 may include that fluorine contained in the resin facilitates the mold release of the nanoimprint on the first patterning region 106.

This can significantly reduce pattern destruction and possible defects caused during the transfer.

Yet another merit of using the fluorine containing resin 601 may be the facilitation of mold release also in the second nanoimprinting regardless of the pattern shape of the mold.

For example, at the time of the second nanoimprinting process such as illustrated in the example shown in FIG. 6B, the resin 401 may intrude, as a run-out resin 402, into a patterned resin 601 in the first patterning region 106 subjected to the first nanoimprinting process.

This phenomenon may occur, for example, when a groove present in an end surface of the mold causes the resin to easily flow to the adjoining patterning region.

Even in this case, however, the use of the fluorine containing resin 601, which has releasability, in the first nanoimprinting process can achieve mold release substantially without adhesion of the transferred resins to each other, thus attaining nanoimprinting to connect patterns to each other with a good accuracy (FIG. 6C).

Although FIGS. 6A to 6C illustrate examples of the method of patterning the fluorine containing resin 601 in the first nanoimprinting process, and then patterning the other resin 401 in the second nanoimprinting process, the same technical effects can be obtained also when the resin patterning order is reversed.

Then, the substrate may be etched using the patterns formed in the multiple imprinting steps as a mask, thus producing a structural member (e.g., a chip) with a predetermined unevenness pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-068851, filed Mar. 18, 2008, which is hereby incorporated by reference herein in its entirety.

What is claimed is:

1. A nanoimprinting method of transferring a pattern of a mold by performing nanoimprinting at least twice, the method comprising:

forming at a region for performing a first nanoimprinting process on a substrate, a first patterning region with a first affinity to resin;

forming at a region for performing a second nanoimprinting process on the substrate, a second patterning region with a second affinity to resin, the second affinity being lower than the first affinity;

applying resin to the first patterning region and transferring a pattern of a mold to the resin by the first nanoimprinting process; and modifying the second patterning region to a region with affinity to resin that is higher than the second affinity, then applying resin to the modified region, and performing the second nanoimprinting process to process the second patterning region thereby connecting patterns formed at the first patterning region and the second patterning region to each other, wherein when performing at least one of the first nanoimprinting process and the second nanoimprinting process, a mold is used which has a processing surface for processing the first patterning region and the second patterning region, the processing surface having formed thereon a third patterning region with a third affinity to resin and a fourth patterning region with a fourth affinity to resin that is higher than the third affinity outside the third patterning region, and wherein at a time of releasing of the mold, the resin applied to the substrate and being in contact with the fourth patterning region on the processing surface of the mold is adhered to the fourth patterning region and removed from the substrate.

2. The nanoimprinting method according to claim 1, wherein affinity to resin refers to either one or both of adhesion to resin and wettability to resin.

3. The nanoimprinting method according to claim 1, wherein the first nanoimprinting process is performed while utilizing a property of the resin whereby spreading to the second patterning region from the first patterning region is suppressed.

4. The nanoimprinting method according to claim 1, wherein the second nanoimprinting process is performed while restricting a region in which the resin spreads by utilizing a resin structure formed by the first nanoimprinting process.

5. The nanoimprinting method according to claim 1, wherein the resin removed from the substrate is resin that runs out from an end surface of the mold when a pattern formed on the processing surface of the mold is transferred.

6. The nanoimprinting method according to claim 5, wherein a surface area of the fourth patterning region is increased over that of the second patterning region, and at the time of releasing of the mold, the resin that runs out is brought into contact with the fourth patterning region and removed from the substrate.

7. The nanoimprinting method according to claim 1, wherein where a width of the third patterning region of the mold is represented by W2 and a width of the fourth patterning region is represented by W1, the relationship of $0.5 \times W2 \leq W1 < W2$ is satisfied.

8. The nanoimprinting method according to claim 1, wherein irradiation with energy is utilized in forming the first patterning region with the first affinity to resin and the second patterning region with the second affinity to resin on the substrate.

9. The nanoimprinting method according to claim 8, wherein the energy is at least one of charged particles and an electromagnetic wave having energy equal to or greater than energy of ultraviolet (UV) light.

10. A structural member production method of transferring a pattern of a mold by performing nanoimprinting at least twice, the method comprising:

forming at a region for performing a first nanoimprinting process on a substrate, a first patterning region with a first affinity to resin;

forming at a region for performing a second nanoimprinting process on the substrate, a second patterning region with a second affinity to resin that is lower than the first affinity;

applying resin to the first patterning region and transferring a pattern of a mold to the resin by the first nanoimprinting process;

modifying the second patterning region to a region with affinity to resin that is higher than the second affinity, then applying resin to the modified region, and performing the second nanoimprinting process to process the second patterning region thereby connecting patterns formed at the first patterning region and the second patterning region to each other; and etching the substrate with the patterns formed by the first and second nanoimprinting process being used as a mask, wherein when performing at least one of the first nanoimprinting process and the second nanoimprinting process, a mold is used which has a processing surface for processing the first patterning region and the second patterning region, the processing surface having formed thereon a third patterning region with a third affinity to resin and a fourth patterning region with a fourth affinity to resin that is higher than the third affinity outside the third patterning region, and wherein at a time of releasing of the mold, the resin applied to the substrate and being in contact with the fourth patterning region on the processing surface of the mold is adhered to the fourth patterning region and removed from the substrate.

11. The structural member production method according to claim 10, wherein the structural member is a chip.

* * * * *